United States Patent [19]
Shichiku et al.

[11] Patent Number: 5,928,312
[45] Date of Patent: *Jul. 27, 1999

[54] DIGITAL FILTER PROCESSING DEVICE

[75] Inventors: Ricardo T. Shichiku; Shinichi Yoshida, both of Nara, Japan

[73] Assignee: Sharp Kabushiki Kaisha, Osaka-fu, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/614,011

[22] Filed: Mar. 12, 1996

[30] Foreign Application Priority Data

Jun. 2, 1995 [JP] Japan .................................. 7-136764

[51] Int. Cl.$^6$ .................................................. G06F 17/10
[52] U.S. Cl. ........................... 708/308; 348/231; 348/614
[58] Field of Search ..................... 364/724.05; 358/350; 348/614, 231; 345/202, 507, 509, 515, 521; 382/242; 386/42

[56] References Cited

U.S. PATENT DOCUMENTS

| | | | |
|---|---|---|---|
| 5,325,189 | 6/1994 | Mimura | 348/231 |
| 5,357,353 | 10/1994 | Hirota | 358/530 |
| 5,410,362 | 4/1995 | Terada et al. | 348/614 |

FOREIGN PATENT DOCUMENTS 6-46412  6/1994  Japan .

OTHER PUBLICATIONS

Microcmputer Architecture Symposium Nov. 12, 1991, Japanese Society of Information Processing Engineers of Japan, "Study on parallel processing system by dynamic data driven porcessor" pp. 9–18.

"Two Dimensional Digital Filtering", Proceesings of the IEEE, vol. 63, No. 4, Apr. 1975, Russell M. Mersereau et al, pp. 610–623.

*Primary Examiner*—William Grant
*Assistant Examiner*—McDieunel Marc

[57] ABSTRACT

A digital filter processing device receives image data of a frame in the order of time series in scanning the frame for carrying out a filter process for every group of image data corresponding to each of a plurality of regions of a predetermined size in the frame. The device receives image data in the order of time series of the scanning operation of a frame to multiply the input image data by a corresponding filter coefficient. This multiplied result is accumulated for every group to be output as an accumulation result. As a result, a region for storing a multiplied result which is an intermediate result of the filter process and an operation for reading out the multiplied result from the storage region for accumulation can be eliminated. Therefore, a filtering process of a frame can be carried out at high speed and in real-time.

17 Claims, 24 Drawing Sheets

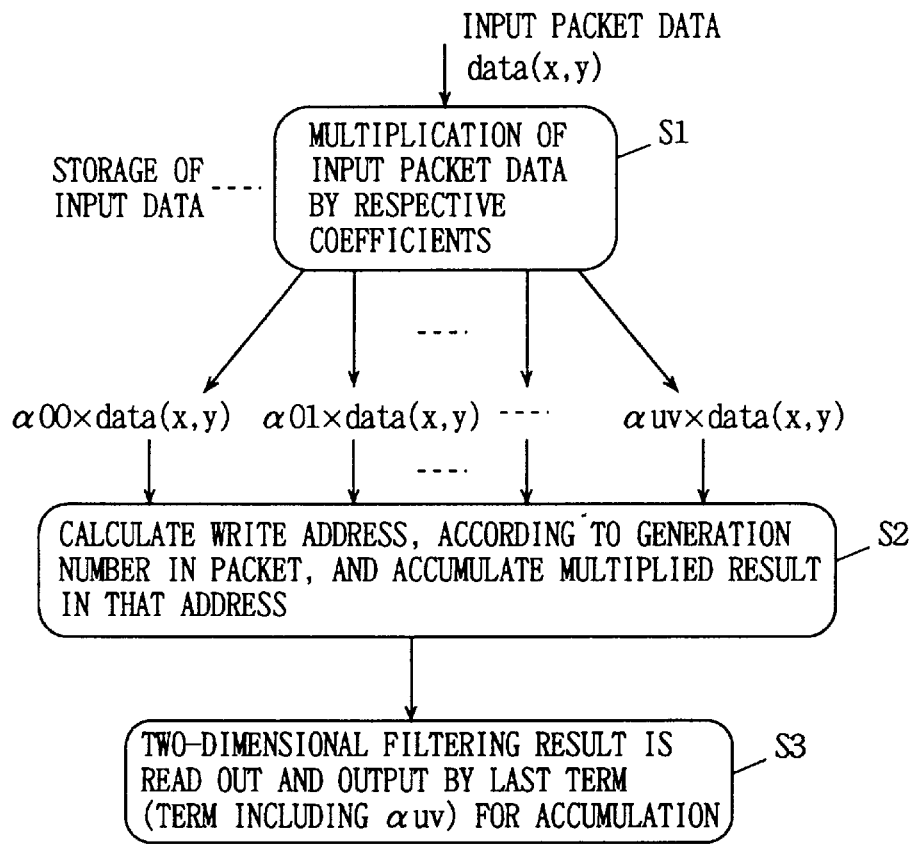

FIG. 3(a)

| α00 | α01 |
|-----|-----|
| α10 | α11 |

FIG. 3(b)

data(1,1)

[α11×data(1,1)]  [α10×data(1,1)]

[α01×data(1,1)]  [α00×data(1,1)]

FIG. 5(a)

| α00 | α01 |
|-----|-----|
| α10 | α11 |

FIG. 5(b)

| data(1,1) * | data(1,2) * | data(1,3) * | ... |
|---|---|---|---|
| data(2,1) | | | |
| | | | |
| [α11×data(1,1)] * | [α10×data(1,1)] * + [α11×data(1,2)] * | [α10×data(1,2)] * + [α11×data(1,3)] * | |
| [α00×data(1,1)] * + [α11×data(2,1)] | [α00×data(1,1)] * + [α01×data(1,2)] * + [α10×data(2,1)] | [α00×data(1,2)] * + [α01×data(1,3)] * | [α00×data(1,3)] * ... |
| [α01×data(2,1)] | [α00×data(2,1)] | | |

| α00 | α01 |
|---|---|
| α10 | α11 |

FIG. 6(b)

| | data(1,1) * | data(1,2) * | data(1,3) * | ... |
|---|---|---|---|---|
| | data(2,1) * | data(2,2) | | |
| | | | | |
| [α11×data(1,1)] * | [α10×data(1,1)] *<br>+ [α11×data(1,2)] * | [α10×data(1,2)] *<br>+ [α11×data(1,3)] * | | |
| [α00×data(1,1)] *<br>+ [α11×data(2,1)] * | [α00×data(1,2)] *<br>+ [α01×data(1,1)] *<br>+ [α10×data(2,1)] *<br>+ [α11×data(2,2)] | [α00×data(1,3)] *<br>+ [α01×data(1,2)] *<br>+ [α10×data(2,2)] * | [α10×data(1,3)] *<br>... | |
| [α01×data(2,1)] * | [α00×data(2,1)] *<br>+ [α01×data(2,2)] | [α00×data(2,2)] | [α00×data(1,3)] *<br>... | |

| α00 | α01 |
|-----|-----|
| α10 | α11 |

FIG. 7(b)

| | data(1,1) * | data(1,2) * | data(1,3) * | |
|---|---|---|---|---|
| | data(2,1) * | data(2,2) * | data(2,3) * | |
| | [α11×data(1,1)] * | [α10×data(1,1)] * + [α11×data(1,2)] * | [α10×data(1,2)] * + [α11×data(1,3)] * | ... |
| | [α01×data(1,1)] * + [α11×data(2,1)] * | [α00×data(1,1)] * + [α01×data(1,2)] * + [α10×data(2,1)] * + [α11×data(2,2)] * | [α00×data(1,2)] * + [α01×data(1,3)] * + [α10×data(2,2)] * + [α11×data(2,3)] * | ... |
| | [α01×data(2,1)] * | [α00×data(2,1)] * + [α01×data(2,2)] * | [α00×data(2,2)] * + [α01×data(2,3)] * | |

| α00 | α01 |
|-----|-----|
| α10 | α11 |

FIG. 8(b)

| data(1,1) * | data(1,2) * | data(1,3) * | ... |
|---|---|---|---|
| data(2,1) * | data(2,2) * | data(2,3) * | ... |
| data(3,1) | | | |
| [α11×data(1,1)] * | [α10×data(1,1)] *<br>+ [α11×data(1,2)] * | [α10×data(1,2)] *<br>+ [α11×data(1,3)] * | [α10×data(1,3)] * |
| [α01×data(1,1)] *<br>+ [α11×data(2,1)] * | [α00×data(1,1)] *<br>+ [α01×data(1,2)] *<br>+ [α10×data(2,1)] *<br>+ [α11×data(2,2)] * | [α00×data(1,2)] *<br>+ [α01×data(1,3)] *<br>+ [α10×data(2,2)] *<br>+ [α11×data(2,3)] * | [α00×data(1,3)] *<br>+ [α10×data(2,3)] * | ... |
| [α01×data(2,1)] *<br>+ [α11×data(3,1)] | [α00×data(2,1)] *<br>+ [α01×data(2,2)] *<br>+ [α10×data(3,1)] | [α00×data(2,2)] *<br>+ [α01×data(2,3)] * | [α00×data(2,3)] * | ... |
| [α01×data(3,1)] | [α00×data(3,1)] | | |

FIG. 9 (a)

| $\alpha 00$ | $\alpha 01$ |
|---|---|
| $\alpha 10$ | $\alpha 11$ | data(1,1) * data(1,2) * data(1,3) * ...
data(2,1) * data(2,2) * data(2,3) * ...
data(3,1) * data(3,2)

FIG. 9 (b)

| data(1,1) * | data(1,2) * | data(1,3) * | ... |
|---|---|---|---|
| data(2,1) * | data(2,2) * | data(2,3) * | ... |
| data(3,1) * | data(3,2) | | |
| $[\alpha 11 \times data(1,1)]$ * | $[\alpha 10 \times data(1,1)]$ * <br> + $[\alpha 11 \times data(1,2)]$ * | $[\alpha 10 \times data(1,2)]$ * <br> + $[\alpha 11 \times data(1,3)]$ * | $[\alpha 10 \times data(1,3)]$ * |
| $[\alpha 01 \times data(1,1)]$ * <br> + $[\alpha 11 \times data(2,1)]$ * | $[\alpha 00 \times data(1,1)]$ * <br> + $[\alpha 01 \times data(1,2)]$ * <br> + $[\alpha 10 \times data(2,1)]$ * <br> + $[\alpha 11 \times data(2,2)]$ * | $[\alpha 00 \times data(1,2)]$ * <br> + $[\alpha 01 \times data(1,3)]$ * <br> + $[\alpha 10 \times data(2,2)]$ * <br> + $[\alpha 11 \times data(2,3)]$ * | $[\alpha 00 \times data(1,3)]$ * <br> + $[\alpha 10 \times data(2,3)]$ * <br> ... |
| $[\alpha 01 \times data(2,1)]$ * <br> + $[\alpha 11 \times data(3,1)]$ * | $[\alpha 00 \times data(2,1)]$ * <br> + $[\alpha 01 \times data(2,2)]$ * <br> + $[\alpha 10 \times data(3,1)]$ * <br> + $[\alpha 11 \times data(3,2)]$ * | $[\alpha 00 \times data(2,2)]$ * <br> + $[\alpha 01 \times data(2,3)]$ * <br> + $[\alpha 10 \times data(3,2)]$ * | $[\alpha 00 \times data(2,3)]$ * <br> ... |
| $[\alpha 11 \times data(3,1)]$ * | $[\alpha 00 \times data(3,1)]$ * <br> + $[\alpha 01 \times data(3,2)]$ * | $[\alpha 11 \times data(3,2)]$ * | |

24,25,27 : DATA TRANSMISSION LINES
28,26 : CONTROL LINES

FIG. 15

| | | | |
|---|---|---|---|
| [α11×data(1,1)] | [α10×data(1,1)]<br>+ [α11×data(1,2)] | [α10×data(1,2)]<br>+ [α11×data(1,3)] | [α10×data(1,3)]<br>⋮ |
| [α01×data(1,1)]<br>+ [α11×data(2,1)] | [α00×data(1,1)]<br>+ [α01×data(1,2)]<br>+ [α10×data(2,1)]<br>+ [α11×data(2,2)] | [α00×data(1,2)]<br>+ [α01×data(1,3)]<br>+ [α10×data(2,2)]<br>+ [α11×data(2,3)] | [α00×data(1,3)]<br>⋮<br>+ [α10×data(2,3)] |
| [α01×data(2,1)]<br>+ [α11×data(3,1)] | [α00×data(2,1)]<br>+ [α01×data(2,2)]<br>+ [α10×data(3,1)]<br>+ [α11×data(3,2)] | [α00×data(2,2)]<br>+ [α01×data(2,3)]<br>+ [α10×data(3,2)]<br>+ [α11×data(3,3)] | [α00×data(2,3)]<br>⋮<br>+ [α10×data(3,3)] |
| [α01×data(3,1)] | [α00×data(3,1)]<br>+ [α01×data(3,2)] | [α00×data(3,2)]<br>+ [α01×data(3,3)] | [α00×data(3,3)] |

F6 : FIRST GENERATION FIELD
F7 : SECOND GENERATION FIELD

15: IMAGE MEMORY UNIT 4,5,7,8,9,10 : DATA TRANSMISSION LINES
6 : MEMORY ACCESS CONTROL LINE

2×2 COEFFICIENTS $\alpha 00, \alpha 01, \alpha 10, \alpha 11$
: ARBITRARY FILTER COEFFICIENTS FIG. 27A PRIOR ART  $\alpha 0$ | $\alpha 1$ FIG. 27B PRIOR ART  $\alpha 0$ | $\alpha 1$ | $\alpha 2$ FIG. 27C PRIOR ART  $\alpha 0$ | $\alpha 1$ | $\alpha 2$ | $\alpha 3$ FIG. 27D PRIOR ART  $\alpha 0$ | $\alpha 1$ | $\alpha 2$ | $\alpha 3$ | $\alpha 4$

FIG. 28 PRIOR ART

PIXEL DIRECTION →

LINE DIRECTION ↓

| $\alpha 00$ | $\alpha 01$ | ... | $\alpha 0v$ |
|---|---|---|---|
| $\alpha 10$ | $\alpha 11$ | ... | $\alpha 1v$ |
| $\alpha 20$ | $\alpha 21$ | ... | $\alpha 2v$ |
| ⋮ | ⋮ | ⋮ | ⋮ |
| $\alpha u0$ | $\alpha u1$ | ... | $\alpha uv$ |

DIGITAL FILTER PROCESSING DEVICE

BACKGROUND OF THE INVENTION

1. Field of the Invention

The present invention relates to digital filter processing devices, and more particularly, to a digital filter processing device that carries out an operation between data read out from a data memory and a filter coefficient.

2. Description of the Background Art

Parallel processing is particularly effective when high speed processing of a great amount of data such as in video signal processing is required. Among parallel processing oriented architecture, attention is particularly focused on data driven type architecture.

In a data driven information processing device, processing is carried out in parallel according to a rule that "a process is effected when all input data required for a certain process are provided and when resources such as an operation device required for that process are assigned".

An operation process associated with digital filter processing is frequently carried out in processing digital video signals in time series in a data driven information processing device.

FIG. 18 is a block diagram showing a structure of a video process oriented data driven information processing device adapted in conventional art and in an embodiment of the present invention.

Such a block structure of FIG. 18 is disclosed in the document of "Study on parallel processing system by dynamic data driven processor" (Microcomputer Architecture Symposium Nov. 12, 1991, Japanese Society of Information Processing Engineers of Japan).

FIG. 19 shows a structure of fields in a data packet applied in conventional art and in an embodiment of the present application.

Referring to FIG. 19, a data packet includes an instruction field F1 storing an operation code C, a generation field F2 for storing a generation number GN#, a first data field F3 for storing first data D1, a second data field F4 for storing second data D2, and a processor field F5 for storing a processor number Pe#.

The video processing oriented data driven information processing device of FIG. 18 includes a data driven processor 1 for video processing, and an image memory unit 15. Image memory unit 15 includes a memory interface 2 and an image memory 3.

Data driven processor 1 includes input ports IV, IA and IB connected to data transmission lines 5, 7 and 8, respectively, and output ports OV, OA and OB connected to data transmission lines 4, 9 and 10, respectively.

An input data packet including a generation number GN# assigned thereto in its input order is entered in time series to data driven processor 1 via input port IA or IB from data transmission lines 7 or 8, respectively. A preset process is stored as a program in processor 1. Processing is carried out according to the contents of the program.

Memory interface 2 receives from output port OV of processor 1 an access request to image memory 3 (reference/update of the contents of image memory 3) via data transmission line 4. Memory interface 2 effects access with respect to image memory 3 via memory access control line 6 according to the received access request. The result is provided to data driven processor 1 via data transmission line 5 and input port IV.

Upon completion of processing of a data packet, data driven processor 1 provides a data packet for signal output via output port OA and transmission line 9 or output port OB and transmission line 10.

FIG. 20 is a block diagram showing a structure of video process oriented data driven processor 1 applied in conventional art and in the embodiment of the present invention.

Data driven processor 1 includes an input processing unit 11, a junction unit 12, a main processing unit 13, a branch unit 14, a PE# register 16, and an output processing unit 17.

An identification number PE# for identifying each processor in a network system are stored in PE# register 16 when the network system includes a plurality of data driven processors 1.

Input processing unit 11 compares the processor number Pe# in a data packet applied via input port IA or IB with identification number PE# in register 16. Determination is made that the input data packet is addressed to the relevant processor when these numbers match each other, whereby that input packet is dispatched to junction unit 12. Determination is made that the input packet is addressed to another processor if the numbers do not match, whereby that input packet is dispatched to output processing unit 17.

Junction unit 12 sequentially receives a data packet sent from input processing unit 11 and a data packet sent from branch unit 14 to dispatch the same to main processing unit 13. Junction unit 12 also detects paired data to dispatch a data packet storing the paired data to main processing unit 13.

Main processing unit 13 carries out a process according to a data flow program stored therein. If access to image memory 3 is required, a data packet is dispatched to image memory unit 15 via output port OV. A data packet after image memory 3 is accessed is received via input port IV.

Similar to input processing unit 11, branch unit 14 compares processing number Pe# of the input packet with identification number PE# in register 16. When these two numbers match each other, the input packet is dispatched to junction unit 12, otherwise to output processing unit 17.

Output processing unit 17 refers to processor number Pe# in the input packet to dispatch that input packet to either output port OA or OB according to a preset branching condition that will be described hereinafter.

The branching condition is set in output processing unit 17 of each processor using an initialization packet prior to dispatch of a data packet to each processor.

A value for masking (referred to as "mask value" hereinafter) and a value for matching (referred to as "match value" hereinafter) are stored in output processing unit 17 in each processor by means of the initialization packet. In a normal process, output processing unit 17 carries out an AND operation between processor number Pe# of the input packet and the pre-stored mask value to compare the result with the prestored match value. When the resultant of the AND operation is identical to the match value, the input packet is dispatched to output port OA, otherwise to output port OB.

Operation code C in a data packet shown in FIG. 19 is an execution instruction regarding the contents of the process on image memory 3, for example a program including reference or update of the contents of image memory 3.

Generation number GN# is an identifier assigned thereto according to the input order in time series at the time of input to data driven processor 1 via data transmission line 7 or 8.

Generation number GN# is used in matching data for detecting paired data in junction unit 12 in data driven processor 1. In memory interface 2 of image memory unit 15, the address to be accessed in image memory 3 is determined according to generation number GN#.

First and second data D1 and D2 are data interpreted according to the contents of a corresponding operation code C. When operation code C indicates update, for example, of the contents in image memory 3, data D1 is the data to be written into image memory 3, and data D2 is disregarded. When operation code C indicates reference to the contents in image memory 3, data D1 and D2 are insignificant.

When a data packet is applied to image memory unit 15 via data transmission path 4, and image memory 3 is accessed according to the contents of the input packet, the accessed result is stored as first data D1 in first data field F3 of that data packet. Then, the data packet is dispatched via data transmission line 5.

The operation of carrying out a two-dimensional digital filter process on an input packet applied to data driven processor 1 in time series via input port IA or IB according to scanning operation of the frame in a video process oriented data driven information processing device will be described hereafter.

FIG. 21 is a flow chart schematically showing a two-dimensional digital filter process using a conventional video process oriented data driven information processing device.

FIG. 22 shows the contents of the region in a memory cell subjected to a two-dimensional digital filter process using a conventional video process oriented data driven information processing device.

FIGS. 23A–23D schematically show the procedure of a two-dimensional digital filter process using a conventional video process oriented data driven information process.

FIG. 24 shows an example of a frame of m×n pixels.

FIG. 25 shows an example of a 2×2 two-dimensional filter coefficient.

FIG. 26 shows a stored state in image memory 3 as a result of a two-dimensional digital filter process on frame data using the filter coefficient of FIG. 25 and m×n frame data of FIG. 24.

A case is considered in carrying out the 2×2 two-dimensional filter process shown in FIG. 25 on a frame of m×n pixels shown in FIG. 24. $\alpha 00, \alpha 01, \alpha 10$ and $\alpha 11$ shown in FIG. 25 are arbitrary filter coefficients.

In a video process oriented data driven information processing device, one frame of image data, i.e. data (1, 1), data (1, 2), . . . , data (1, n), data (2, 1), data (2, 2), . . . , data (2, n), . . . , data (m, n) input in a time series manner is stored in image memory 3 of image memory unit 15. A two-dimensional filter process is carried out thereon to output the result.

FIG. 22 shows a region of image memory 3 for storing data associated with this two-dimensional filter process.

Image memory 3 includes a region Ea for temporarily storing data of a packet applied to the video process oriented data driven information processing device, a region Eb for storing temporarily respective multiplied results as intermediate results, and a region Ec for accumulating the multiplied results.

At step S100 in FIG. 21, data (all data of one frame) stored in a data packet applied via input port IA or IB is stored in region Ea of image memory 3 via main processing unit 13 and output port OV.

At step S101, main processing unit 13 determines whether all the multiplication of a data value within a range of interest in region Ea and a corresponding filter coefficient is completed or not.

Each multiplication is carried out at steps S102 and S103 between a relevant data value (data (1, 1), data (1, 2), data (2, 1) and data (2, 2) in FIG. 23A) and a corresponding filter coefficient (60 00, $\alpha 01, \alpha 10$ and $\alpha 11$ of FIG. 23A).

Main processing unit 13 provides the data packet to image memory unit 15 via output port OV. The data value of interest is read out from memory 3 to be stored into that data packet and applied to main processing unit 13. Main processing unit 13 receives the data packet and reads out the filter coefficient to carry out the above-described multiplication.

At step S104, the data packet storing the multiplied result is provided to image memory unit 15 via output port OV. The multiplied result is written into region Eb shown in FIG. 22. After this writing operation, that data packet is returned to main processing unit 13.

The above steps S102–S104 are carried out, i.e. repeated for 4 times, until determination is made that the multiplication operation is completed in step S101.

At step S105, determination is made whether the adding operation within the range of interest of the two-dimensional filter is completed or not in main processing unit 13.

Each adding operation is carried out in steps S106 and S107. More specifically, the multiplied result stored in region Eb as an intermediate result is read out from image memory 3 and sequentially accumulated into region Ec that stores the final result corresponding to the range of interest.

Therefore, main processing unit 13 provides a data packet to image memory unit 15 via output port OV, whereby data of interest (multiplied result) is read out from image memory 3. The readout data is accumulated and written into the contents of a corresponding address in region Ec of image memory 3 in image memory unit 15. Then, the data packet is returned to main processing unit 13.

The process of steps S106 and S107 is carried out until determination is made that the adding operation (accumulation) is completed at step S105. In other words, the process of steps S106 and S107 is repeated four times.

At the end of the adding operation, the data packet at the final (fourth) accumulation is provided to image memory unit 15 via output port OV at step S108. Thus, the result of the two-dimensional filter after accumulation is read out.

At step S109, the data packet storing the result of the two-dimensional filter is returned to main processing unit 13 and provided from output port OA of OB. At main processing unit 13, determination is made whether the two-dimensional filter process for one frame is completed or not.

If the two-dimensional filter process for one frame is not yet completed, a similar two-dimensional filter process is initiated at step S110 for the next range of the two-dimension filter process.

When a two-dimensional filter process for one frame is completed, a similar two-dimensional filter process is repeated for the next frame at step S111. Since data applied to the processor is of one frame, the two-dimensional filter process for one frame is completed when determination is made of completion of computation at step S109.

When the two-dimensional filter process on data (1, 1)–data (2, 2) shown in FIG. 23A ends, the range of 2× 2 is shifted rightwards by one column, and a two-dimensional filter process is repeated for the range of data (1, 2), data (1, 3), data (2, 2) and data (2, 3), i.e. data (1, 2)–data (2, 3), as shown in FIG. 23B.

When the range of 2×2 data is shifted rightwards and arrives at the right end of one frame data as shown in FIG. 32C, the range of 2×2 data is then shifted downward by one row to repeat the computation by being shifted from the left end to the right end by one column as shown in FIG. 23D.

The stored results of the two-dimensional filter process on the m×n frame data is shown in FIG. 26 as the shaded portion. This shaded portion is included in region Ec of FIG. 22.

Since the result of the two-dimensional filter process on data (1, 1)–data (2, 2) of the range of interest shown in FIG. 23A is 2DF(2, 2)=[α00×data (1, 1)]+[α01×data (1, 2)]+ [α10×data (2, 1)]+[α11×data (2, 2)], a memory region the multiplied result by each filter coefficient in [ ] is required in image memory 3, as well as a memory region Ec for storing the accumulation of each multiplied result.

The art of the above-described two-dimensional filter process is disposed in "Two-dimensional Digital Filtering" (Proceedings of the IEEE, Vol. 63, No. 4, April 1975 pp. 610–623).

The technique disclosed in this document employs the distributive law in a two-dimensional filter process using a filter coefficient of symmetry.

The symmetry of a coefficient filter will be described hereinafter.

FIGS. 27A–27D are diagrams for describing the symmetry of a one-dimensional filter coefficient.

FIG. 28 is a diagram for describing the symmetry of a two-dimensional filter coefficients.

The filter coefficients of FIG. 27A are symmetrical, implying that $\alpha 0=\alpha 1$, and similarly, $\alpha 0=\alpha 2$ in FIG. 27B, $\alpha 1=\alpha 2$ and $\alpha 0=\alpha 3$ in FIG. 27C, and $\alpha 1=\alpha 3$ and $\alpha 0=\alpha 4$ in FIG. 27D.

In the two-dimensional filter coefficients shown in FIG. 28, the filter coefficients in the pixel direction are $\alpha 00$, $\alpha 01, \ldots, \alpha 0v$, and the filter coefficients in the line direction are $\alpha 00, \alpha 10, \ldots, \alpha u0$.

Symmetrical filter coefficients in the pixel direction establish $\alpha 00=\alpha 0v$, $\alpha 01=\alpha 0(v-1)$. Similarly, symmetrical filter coefficients in the line direction establish $\alpha 00=\alpha u0$, $\alpha 10=\alpha(u-1)0$.

Therefore, symmetrical filter coefficients in the pixel direction and the line direction yield $\alpha 00=\alpha 0v=\alpha u0=\alpha uv$, $\alpha 01=\alpha 0(v-1)=\alpha u1=\alpha u(v-1), \ldots$.

The technique disclosed in the above-mentioned document has an advantage that the operation time is reduced since the distributive law is employed. However, this technique is implemented on the basis that all the frame data required for a digital filter process are provided. Therefore, there is no disclosure as to the real time process of input data.

Japanese Patent Publication No. 6-46412 discloses a data processor that improves operation performance.

The process carried out by this processor is limited to a convolution process that multiplies a plurality of data on an external memory respectively by a certain coefficient and taking the sum of the products. There is no disclosure of processing data applied in real time from the outside world.

Furthermore, since the process disclosed in the publication requires that all the data to be processed is prestored in a memory, this processing system is not applicable to the operation of processing data in real time applied from the outside world.

The above-described two-dimensional digital filter process according to FIG. 21 is disadvantageous in that usage of image memory 3 is not efficient, and the number of unnecessary accesses to image memory 3 is great.

More specifically, it is necessary to provide a memory region for temporarily storing all input image data (region Ea of FIG. 22), a memory region for temporarily storing the multiplication result between each image data and a filter coefficient (region Eb of FIG. 22), and a memory region for storing the accumulated value of the multiplied results (region Ec of FIG. 22) in image memory 3.

Furthermore, a greater number of data in one frame and a greater number of coefficients in a two-dimensional filter causes increase in the size of the memory for storing temporarily input image data and the processed intermediate results.

In carrying out one instruction in video process oriented data driven processor 1, a data packet circulates the internal pipeline of data driven processor 1. More specifically, the data packet travels from main processing unit 13→branch unit 14→junction unit 12→main processing unit 13 during execution of one instruction. Similarly, a data packet returns to data driven processor 1 via memory interface 2 to continue a similar process when image memory 3 is accessed by data driven processor 1. Here, an off-chip data transfer (external of processor 1) associated with the memory access operation should be minimized in high speed signal processing since it is slow in comparison to on-chip (internal of process 1) data transfer.

Conventionally, off-chip data transfer is required to access image memory 3 from data driven processor 1. This becomes a bottleneck in improving the transfer rate of a data packet. Therefore, the processing speed cannot be increased.

The access from processor 1 to image memory 3 becomes more frequent in proportion to increase the number of data in one frame and the number of filter coefficients for a two-dimension al digital filter process. It was therefore difficult to improve the process capability.

All the input data to be processed must be once stored in the process disclosed in the aforementioned "Two Dimensional Digital Filtering" and in the convolution process disclosed in Japanese Patent Publication No. 6-46412. There was a disadvantage that the number of data that can be input depends upon the memory size of the processor. Furthermore, it is not suitable for real time processing of input data.

SUMMARY OF THE INVENTION

An object of the present invention is to provide a digital filter processing device that allows real-time processing at high speed.

A digital filter processing device according to an aspect of the present invention receives a plurality of image data forming a frame for carrying out a digital filter process using a filter coefficient corresponding to each of image data in a group, for every group of image data corresponding to each of a plurality of regions of a predetermined area in a frame. The digital filter processing device includes a storage unit to receive and store each of a plurality of image data in the order of time series according to a scanning operation of a frame. The stored image data is multiplied by a corresponding filter coefficient. The multiplied result is accumulated for each group to be output as an accumulation result. Therefore, in time series according to a scanning operation of a frame, image data can be subjected to digital filtering to improve the processing speed.

The digital filter processing device further includes a processing unit for data transfer with the storage unit. The processing unit includes a multiply unit for reading out image data from the storage unit and multiplying read out image data by a corresponding filter coefficient sequentially in time series, an accumulation unit for sequentially accumulating and storing in time series the multiplied result from the multiply unit into the contents of a predetermined address corresponding to the image data that was multiplied in the storage unit, and a read out unit for reading out the result of a corresponding accumulation from the storage unit when the accumulation is completed for every group. Since the multiplied result from the multiply unit is stored while being accumulated into a predetermined address in the storage unit, the region for storing temporarily just the multiplied result in the storage unit is eliminated. Therefore, the processing speed is improved due to efficient usage of the storage unit and reduction in the number of accesses to the storage unit in a digital filter process.

When each of the filter coefficients corresponding to the respective image data in a group has the same value symmetrically in at least one of a horizontal direction and a vertical direction in the frame, the distributive law is applied in the multiplication and accumulation operation. Therefore, the amount of computation associated with the process of multiplication and accumulation is reduced to further improve the processing speed.

The digital filter processing device allows concurrent access in which two addresses in the storage unit are referred to simultaneously by one access. As a result, the number of access times of the storage unit is reduced to further improve the processing speed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic flow chart for carrying out a two-dimensional digital filter process using a video process oriented data driven processor according to a first embodiment of the present invention.

FIG. 2 shows an example of 2×2 filter coefficients used in the process of the flow chart of FIG. 1.

FIGS. 3(a)–10(b) are diagrams for describing the development of computation of input image data using 2×2 two-dimensional filter coefficients according to the first embodiment of the present invention.

FIG. 15 is a diagram for describing the procedure of the 2×2 two-dimensional digital filter process according to the second embodiment of the present invention.

FIGS. 27A–27D are diagrams for describing the symmetry of one-dimensional filter coefficients.

FIG. 28 is a diagram for describing the symmetry of two-dimensional filter coefficients.

DESCRIPTION OF THE PREFERRED EMBODIMENTS

Figure 19:
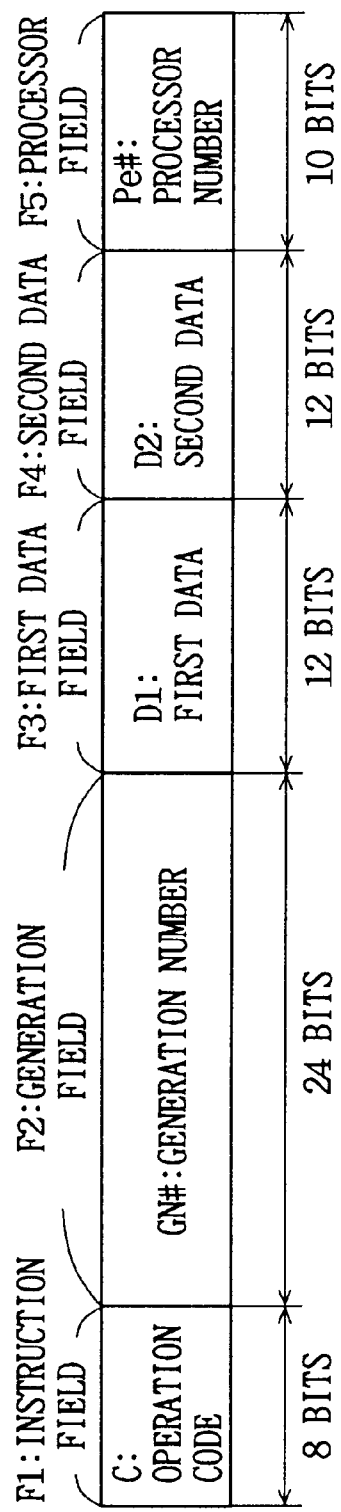
FIG. 19 shows the field structure of a data packet applied in conventional art and in the embodiments of the present invention.
Figure 20:
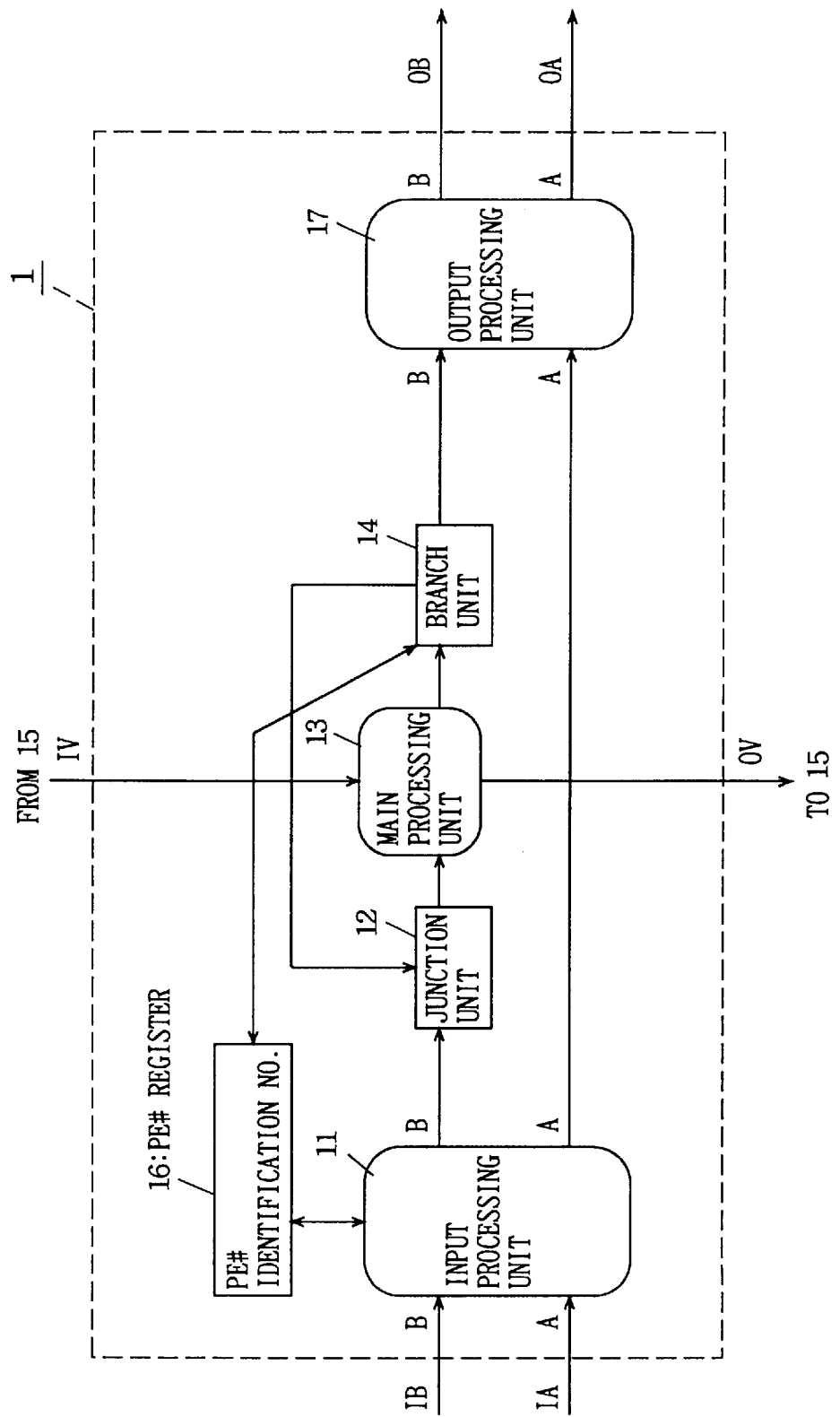
FIG. 20 is a block diagram showing a structure of a video process oriented data driven processor 1 applied in conventional art and in the embodiment of the present invention.
Figure 21:
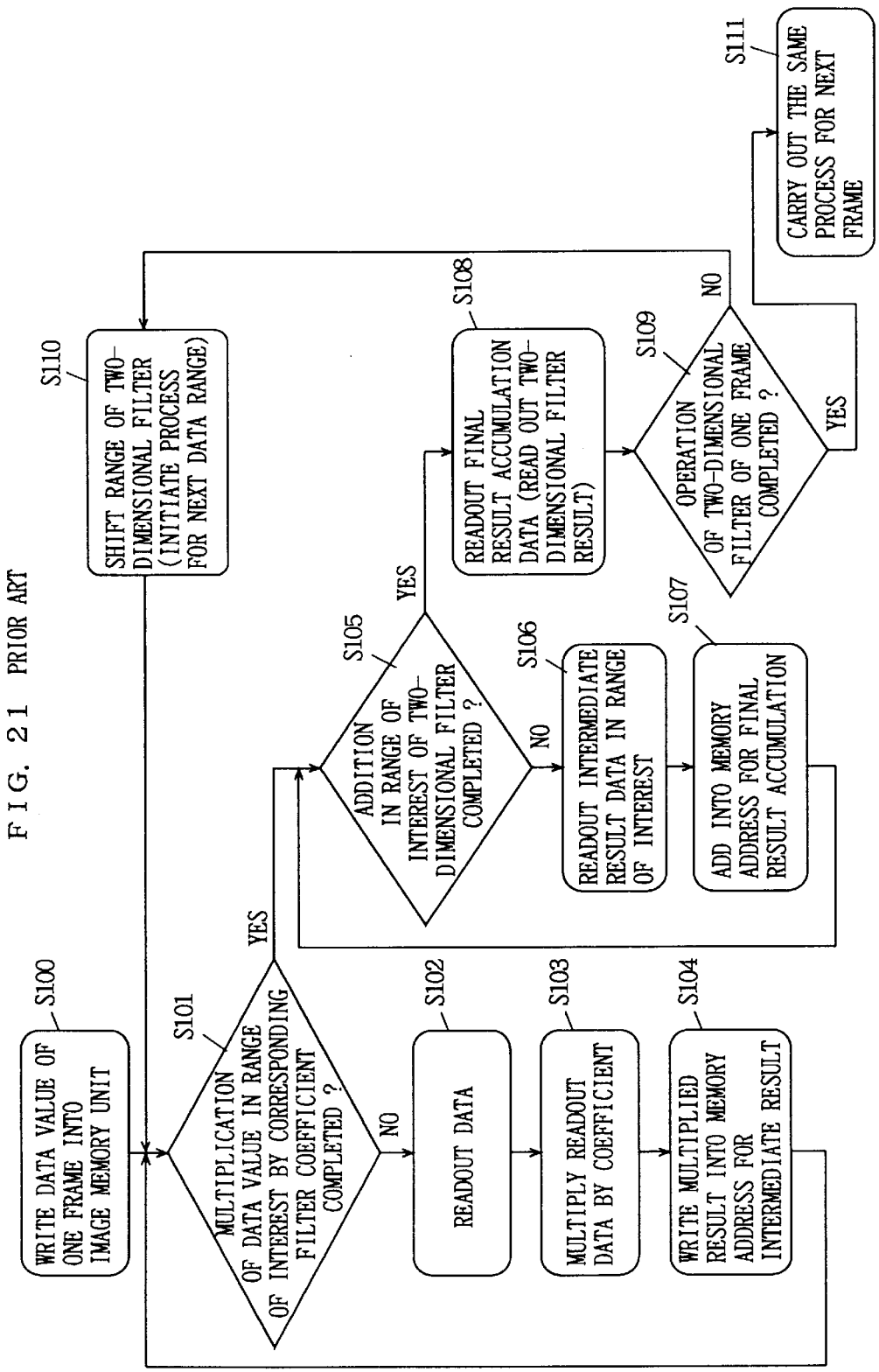
FIG. 21 is a schematic flow chart of a two-dimensional digital filter process using a conventional video process oriented data driven information processing device.

The data driven processor and data packet employed in the first to third embodiments of the present invention are similar to those already shown in FIGS. 20 and 19, and are not otherwise described herein.

First Embodiment

The procedure of the digital filter processing device of the present embodiment differs from the procedure of conventional art in that all input data of one frame does not have to be written in image memory 3 prior to the process.

In the present embodiment, only the data required for processing is written into memory 3. The required data is read out and multiplied by a corresponding filter coefficient. The multiplied result is sequentially added into a corresponding address in memory 3 for the final result storage (additional storage while accumulating). The two-dimensional filter process result is read out by a data packet corresponding to the final term of accumulation-to be output as a result of two-dimensional digital filter process of a range of interest.

Figures 4A, 4B:
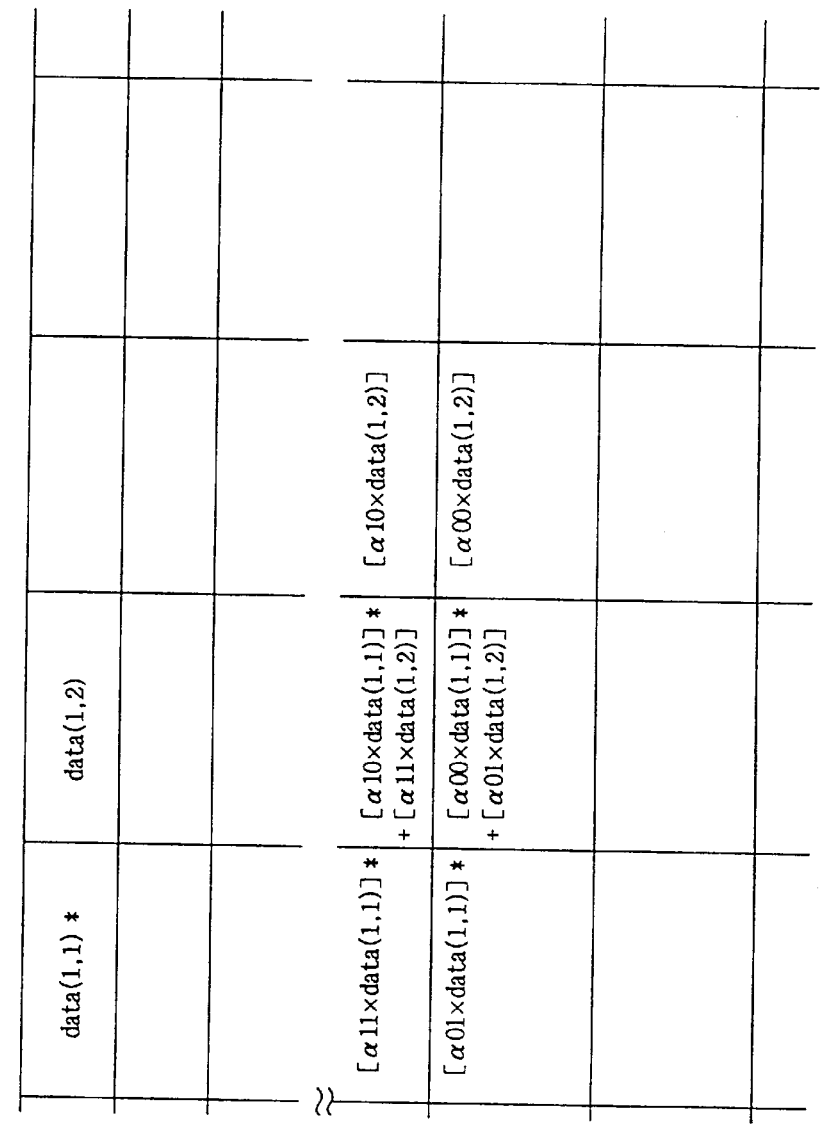
Figures 10A, 10B:
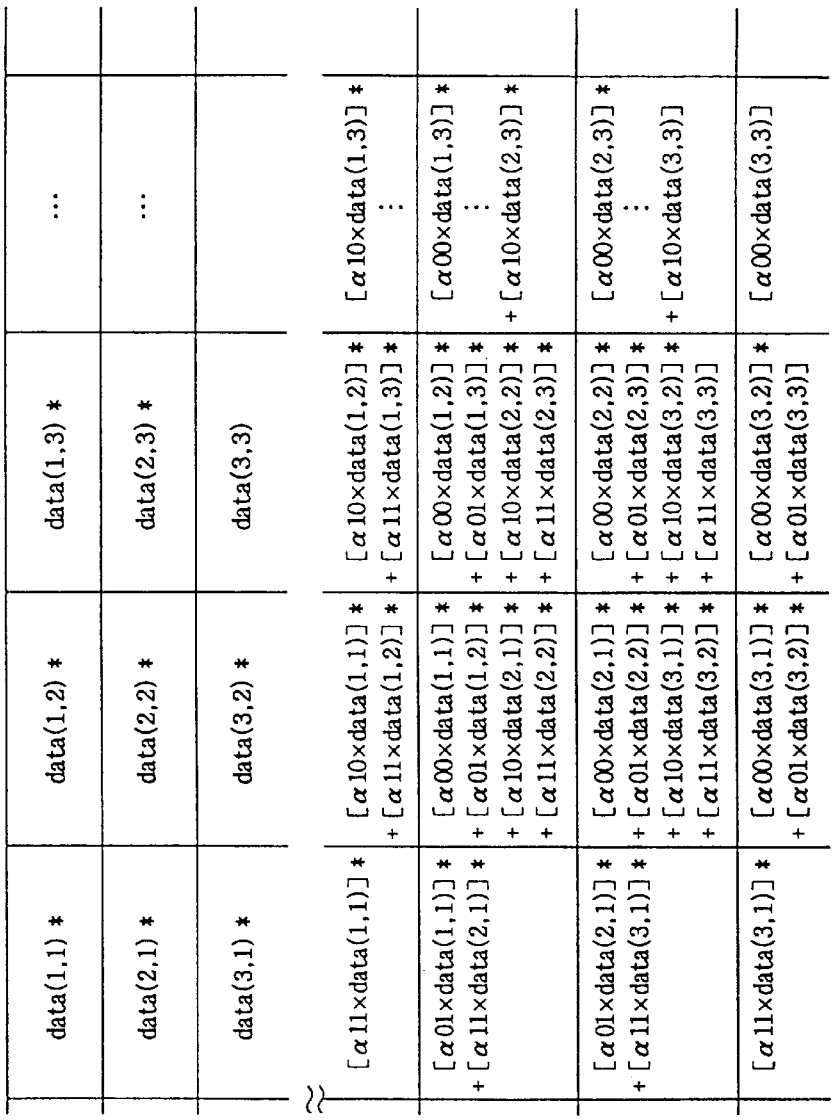
Figure 11:
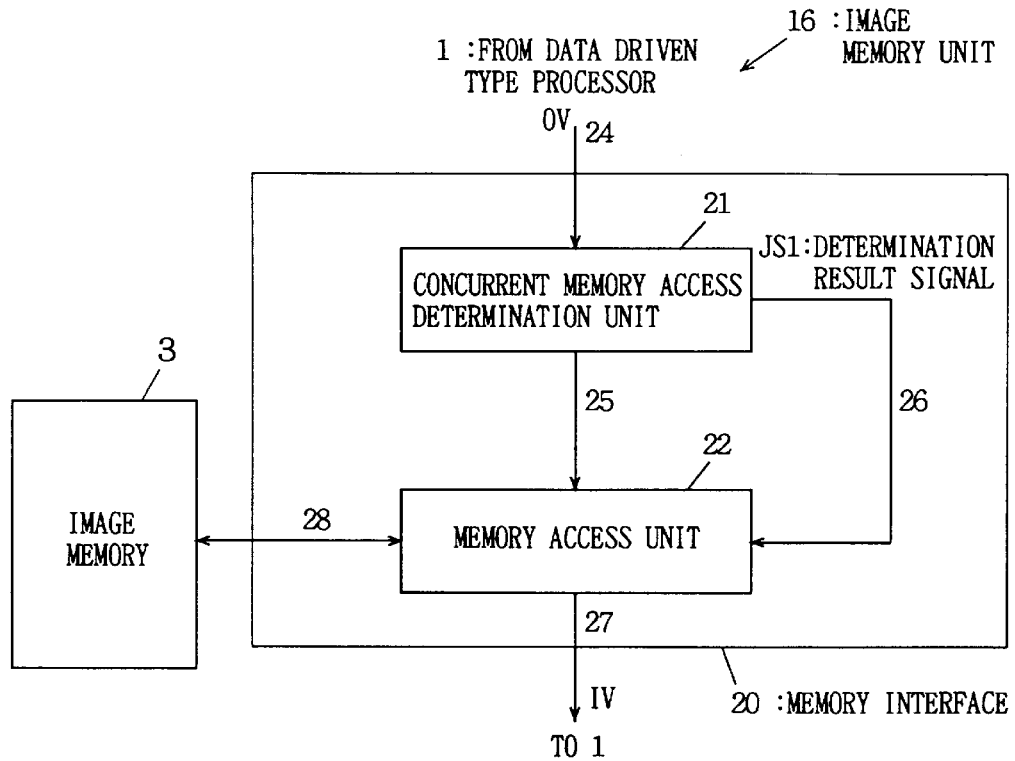
FIG. 11 is a block diagram showing a structure of an image memory unit 16 applied in the embodiment of the present invention.
Figure 18:
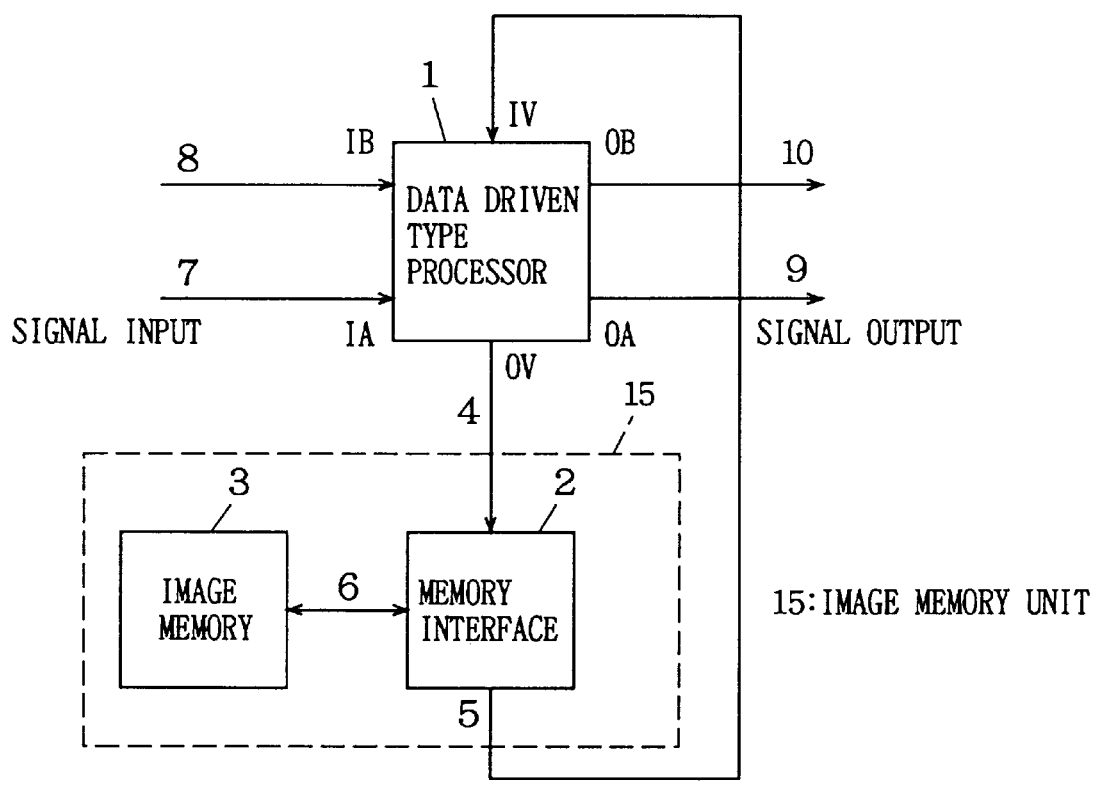
FIG. 18 is a block diagram showing a structure of a video process oriented data driven information processing device applied in conventional art and in the embodiments of the present invention.

It is to be noted that an image memory unit 16 shown in FIG. 11 is provided instead of image memory unit 15 shown in FIG. 18 in the present invention.

Image memory unit 16 includes an image memory 3 and a memory interface 20 to access image memory 3. Memory interface 20 includes a concurrent memory access determination unit 21 and a memory access unit 22.

Concurrent memory access determination unit 21 has its input side connected to an output port OV of data driven processor 1 via a data transmission line 24, and its output side connected to the input side of memory access unit 22 via a data transmission line 25. Memory access unit 22 is connected to image memory 3 via a memory access control line 28, to concurrent memory access determination unit 21 via a control line 26 through which a determination result signal S1 is transmitted, and to an input port IV of data driven processor 1 via data transmission line 27.

Concurrent memory access determination unit 21 determines whether operation code C of an input data packet via transmission line 24 is an instruction that requires concurrent access of two address locations in image memory 3, whereby a determination result signal JS1 and the input packet are provided to memory access unit 22 via control line 26 and transmission line 25, respectively.

Memory access unit 22 accesses image memory 3 according to determination result signal JS1 and the contents of the input packet in response to input of a data packet. Here, the generation number GN# of the input packet is used as the address for access.

For example, when determination result signal JS1 indicates non-concurrent memory access, memory access unit 22 accesses memory 3 by addressing based on generation number GN# in the input packet according to operation code C.

When determination result signal JS1 indicates concurrent memory access, memory access unit 22 accesses memory 3 by two addressings based on generation number GN# according to operation code C in the input packet. Details of concurrent memory access will be described in the third embodiment.

It is assumed that respective (a) in FIGS. 3–10 is input frame data, and each data (x, y) indicates one pixel data. A portion of the stored contents in memory 3 of image memory unit 16 is shown in respective (b) of FIGS. 3–10.

In FIGS. 3(a)–10(b), previously input data and multiplied result data written into memory 3 using the input data are denoted with * at its end.

The operation will be described hereinafter.

At step S1 of FIG. 1, image data (1, 1) is stored in a data packet and applied in time series according to a scanning operation of a frame to data driven processor 1 via input port IA or IB, whereby data (1, 1) in the data packet is written into image memory 3 (refer to FIG. 3(b)) via main processing unit 13 and output port OB. Then, the data packet is returned to main processing unit 13.

In main processing unit 13, multiplication of input data (1, 1) in the input packet and a filter coefficient (refer to FIG. 2) is carried out.

At step S2, each multiplied result is applied to image memory unit 16 via output port OV. The contents of a corresponding address storing the last result of two-dimensional filtering in image memory 3 is updated according to the input multiplied result or the current multiplied result is accumulated thereto (refer to FIG. 3(b)).

Each of subsequently input image data (1, 2), . . . , data (2, 2) are subjected to a process similar to that shown in steps S1 and S2 to be accumulated into the contents of a corresponding address that stores the last result in memory 3 on the basis of multiplication of each data and a filter coefficient.

When a multiplied result associated with input image data (2, 2) is applied to image memory unit 16 via output port OV, addition is carried out between a reference value of a corresponding address (i.e., accumulation result value of [α00×data (1, 1)]+[α01×data (1, 2)]+[α10×data (2, 1)] and the multiplied result (i.e., [α11×data (2, 2)] in image memory unit 16.

At step S3, the data packet storing the 2×2 two-dimensional digital filter process result on image data (1, 1), data (1, 2), data (2, 1) and data (2, 2) is applied to main processing unit 13 of processor 1 from image memory unit 16 via input port IV. This data packet is the data packet that stores the final multiplied result.

The data packet storing the resultant value of the 2×2 two-dimensional digital filter process on image data (1, 1), data (1, 2), data (2, 1) and data (2, 2) is provided to the outside world from output port OA or OB via main processing unit 13, branch unit 14, and output processing unit 17.

Here, the input status of the image data and the stored contents of image memory 3 show a transition of FIGS. 4(a)–4(b) FIGS. 5(a)–5(b) FIGS. 6(a)–6(b)

FIG. 3(b) shows the last data written into image memory 3 via data driven processor 1 and memory interface 20. As described above, the input data is multiplied by each filter coefficient shown in FIG. 2 in processor 1. Each multiplied result is written into a corresponding address for final result accumulation in memory 3.

It is shown in FIG. 3(a) that image data (1, 1) is the object of operation. It is shown in FIG. 3(b) that input image data (1, 1) is written into a predetermined address in image memory 3, and that the multiplied result with a digital filter coefficient is written into memory 3.

Figure 26:
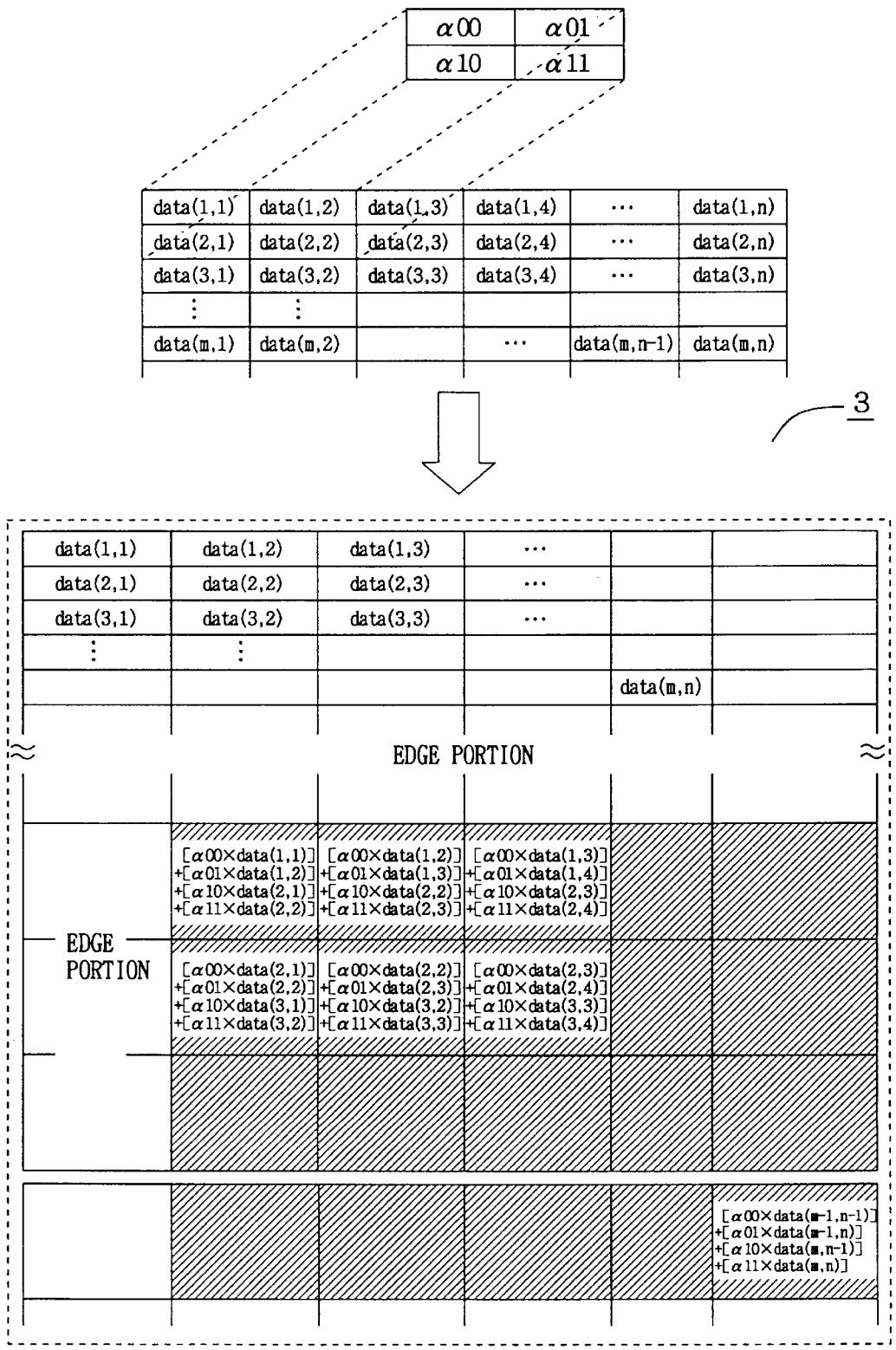
FIG. 26 shows a stored state in image memory 3 as the m×n frame data of FIG. 24 and the results of a two-dimensional digital filter process using the filter coefficients of FIG. 25 on frame data.

In this case, the multiplied results other than [α00×data (1, 1)] is not used as the result of the two-dimensional digital filter process with respect to data (1, 1) since that input image data (1, 1) corresponds to the edge portion of the input image (refer to FIG. 26).

When image data remote from the edge portion, for example image data (2, 2) shown in FIG. 6(a) is written into image memory 3, data (2, 2) is read out once from image memory 3 in a 2×2 two-dimensional digital filter process. That packet is copied three times in main processing unit 13 (a total of four of the same packets), and multiplication with respective filter coefficients is carried out.

More specifically, multiplication of [α11 data (2, 2)], [α10×data (2, 2)], [α01×data (2, 2)] and [α00×data (2, 2)] is carried out. Each multiplied result is added into the contents of respective addresses in image memory 3 that stores the accumulation result of 2DF(2, 2), 2DF(2, 3), 2DF(3, 2) and 2DF(3, 3) shown in the following equations (1)–(4).

$$2DF(2, 2)=[\alpha00\times data (1, 1)]+[\alpha01\times data (1, 2)]+[\alpha10\times data (2, 1)]+[\alpha11\times data (2, 2)] \quad (1)$$

$$2DF(2, 3)=[\alpha00\times data (1, 2)]+[\alpha01\times data (1, 3)]+[\alpha10\times data (2, 2)]+[\alpha11\times data (2, 3)^*] \quad (2)$$

$$2DF(3, 2)=[\alpha00\times data (2, 1)]+[\alpha01\times data (2, 2)]+[\alpha10\times data (3, 1)^*]+[\alpha11\times data (3, 2)^*] \quad (3)$$

$$2DF(3, 3)=[\alpha00\times data (2, 2)]+[\alpha01\times data (2, 3)^*]+[\alpha10\times data (3, 2)^*]+[\alpha11\times data (3, 3)^*] \quad (4)$$

It is to be noted that image data with * at its end in the above equations is not yet input when the underlined data 2, 2) is read out from memory 3.

It is appreciated from the above equation (1) that the multiplied results of [α11×data (2, 2)] is added into the contents of the address that stores accumulation result 2DF(2, 2). Since that multiplied result is the last accumulation term with respect to result 2DF(2, 2), the contents of that address is read out accordingly to be stored in the data packet that stores the final accumulation term. This data packet is provided to processor 1. As a result, the result of a 2×2 two-dimensional digital filter process on data (1, 1), data (1, 2), data (2, 1) and data (2, 2) is output.

Thus, a multiplication process with a corresponding filter coefficient in the filter operation is carried out as soon as image data is input in video process oriented data driven processor 1. Then, a process is effected so that each multiplied result is added into the contents of a corresponding address for storing the final accumulation result in a corresponding image memory 3.

Figure 22:
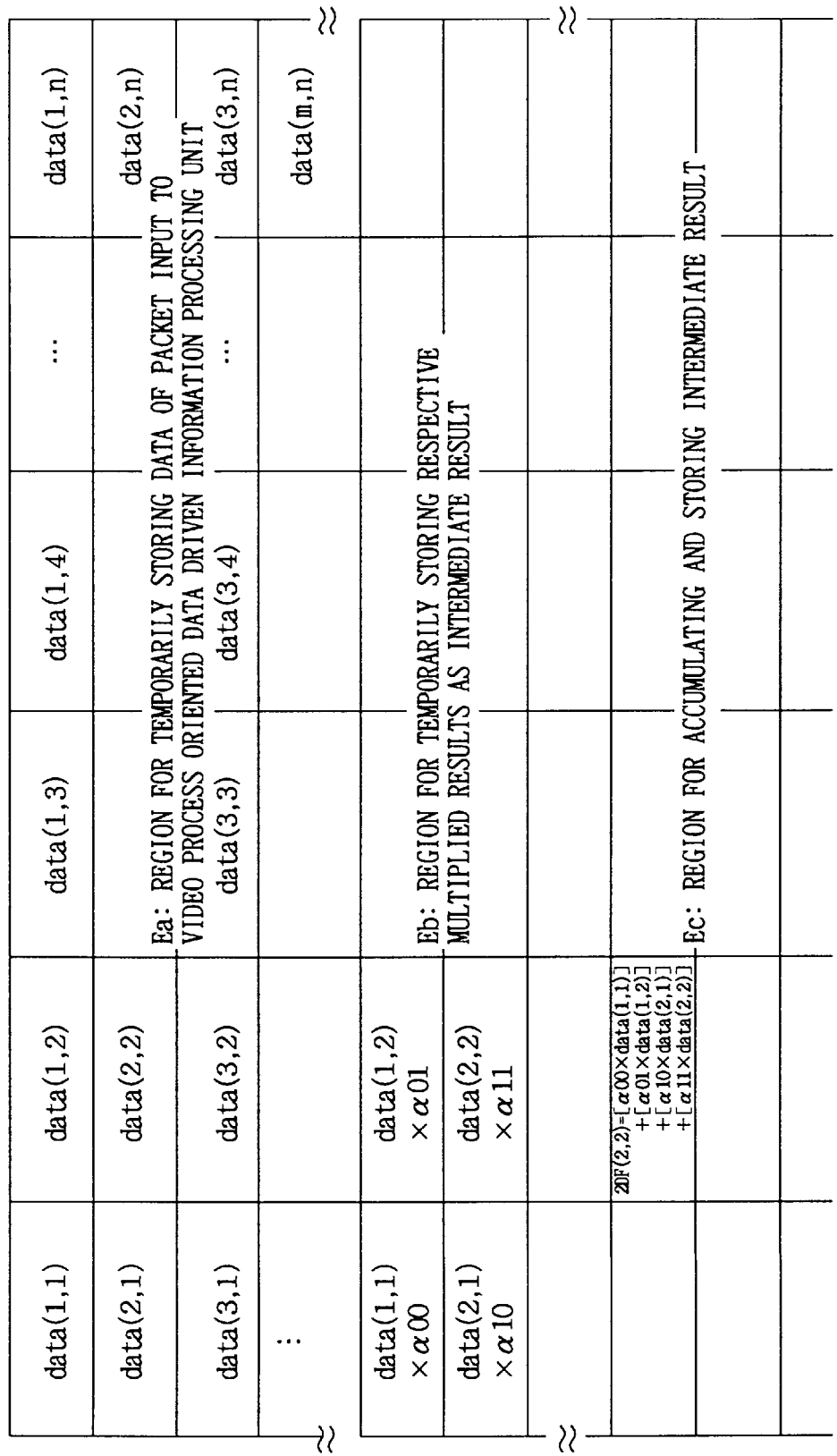
FIG. 22 shows the contents of regions in a memory cell subjected to a two-dimensional digital filter process using a conventional video process oriented data driven information processing device.
Figure 23A:
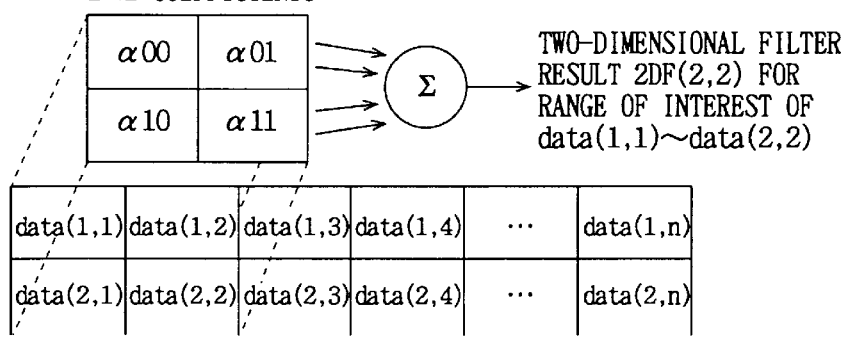
FIGS. 23A–23D schematically show the procedure of a two-dimensional digital filter process using a conventional video process oriented data driven information processing device.
Figure 23B:
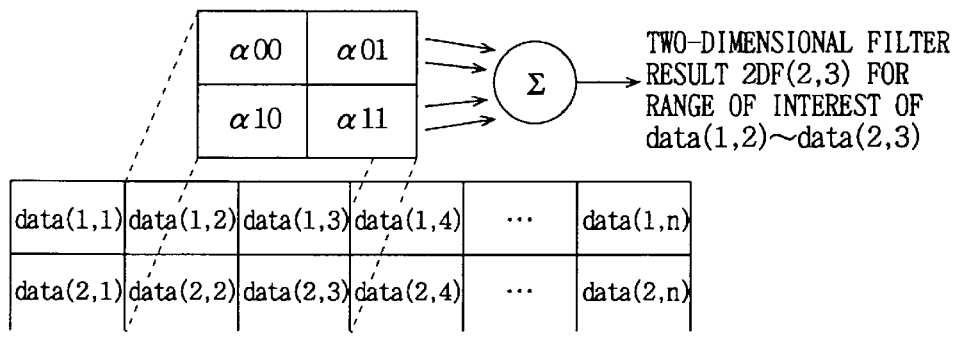
Figure 23C:
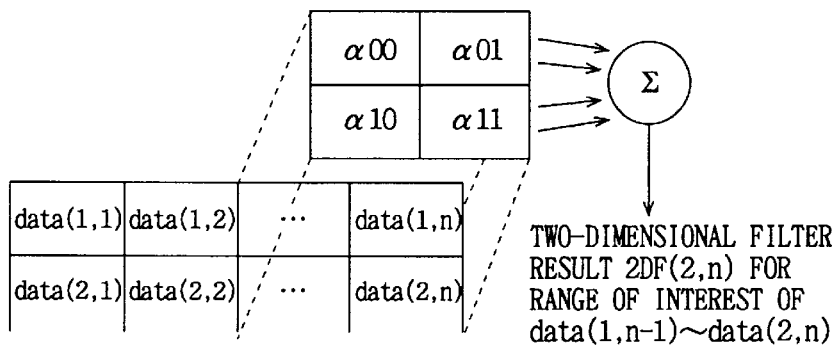
Figure 23D:
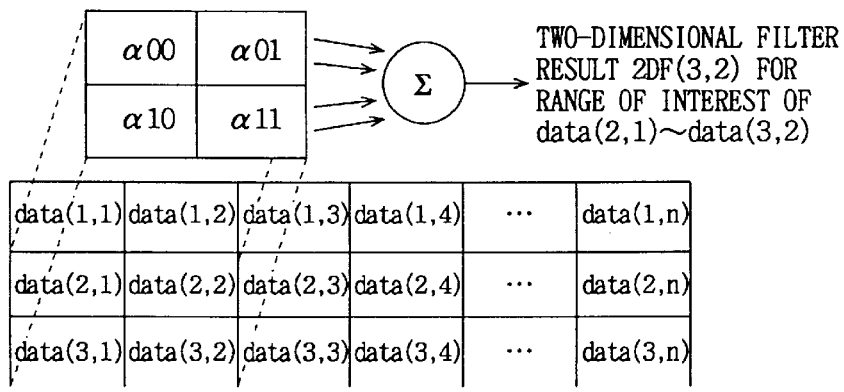
Figure 24:
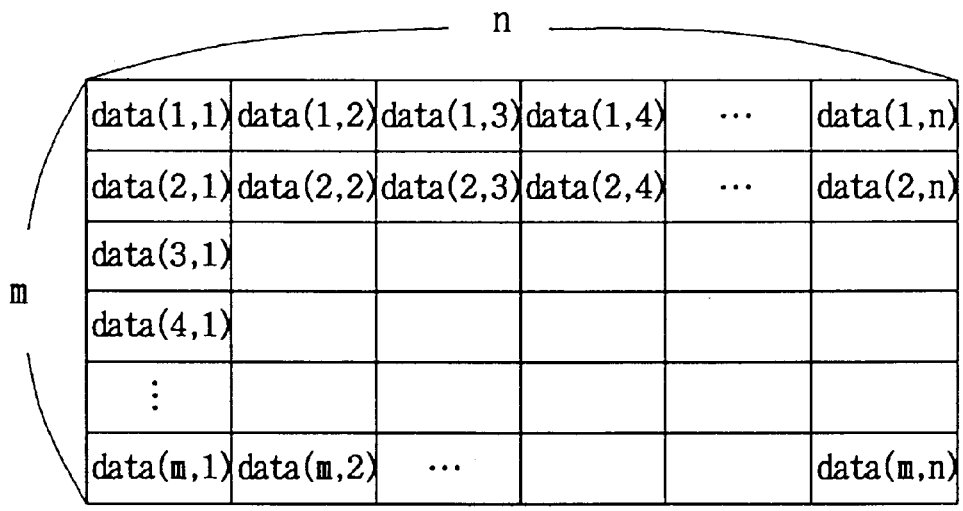
FIG. 24 shows an example of a frame of m×n pixels.
Figure 25:
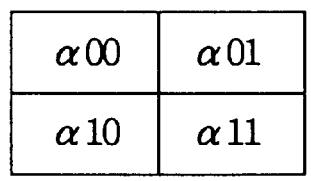
FIG. 25 shows an example of 2×2 two-dimensional filter coefficients.

As a result, a real-time filter process on input image data is allowed in the present embodiment. In contrast to conventional art, the writing operation for storing all the image data of one frame in image memory 3, and a memory region (region Eb in FIG. 22) for temporarily storing each intermediate result value (multiplied result) related to filtering are not required to facilitate high speed process and effective usage of the memory.

Since the temporary storage operation of an intermediate result is eliminated, the frequency of access of processor 1 towards image memory 3 is reduced to alleviate the bottleneck in improving the processing speed by off-chip data transfer.

The invention is not limited to the present embodiment in which 2×2 two-dimensional filter coefficients are employed. The filter coefficient may be m×n two-dimensional or one-dimensional.

Second Embodiment

The procedure of a digital filter processing device of the present embodiment provides the advantages that the writing operation for prestoring all image data of one frame into image memory 3 prior to a process is unrequired, and that the amount of processing, i.e. the amount of computation, is reduced taking advantage of the symmetry of filter coefficients.

This feature associated with reduction in the amount of computation is not limited to two-dimensional filter coefficients, and can be achieved even for a one-dimensional filter coefficients. A process employing one-dimensional digital filter coefficients with symmetry will be described hereinafter with reference to FIGS. 12 and 13.

Figure 12:
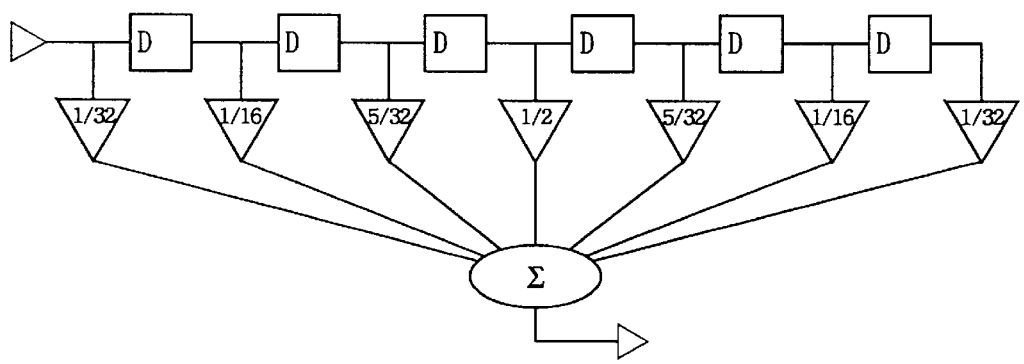
FIG. 12 is a signal flow graph according to a one-dimensional filter coefficient possessing conventional symmetry.
Figure 13:
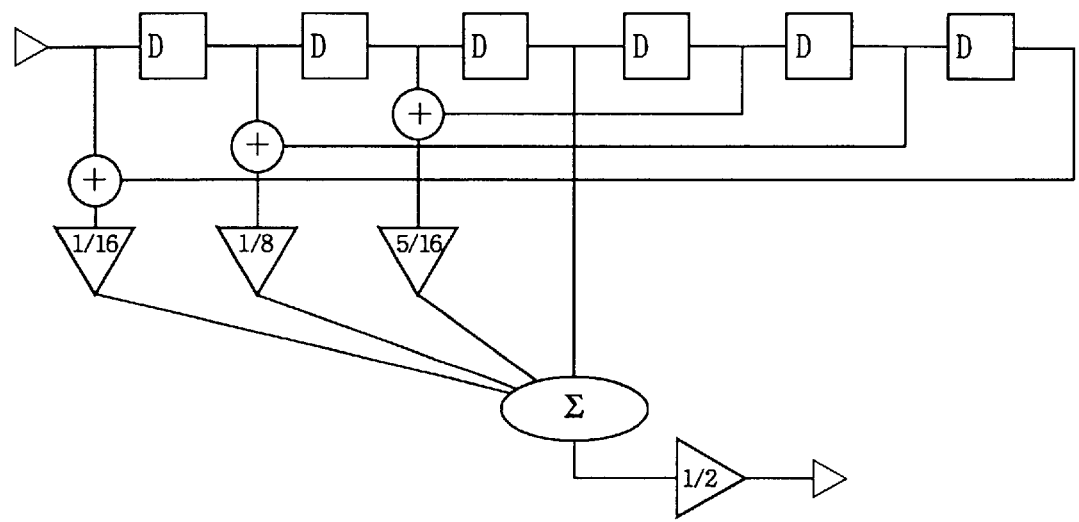
FIG. 13 is a signal flow graph according to a one-dimensional filter coefficient possessing symmetry according to a second embodiment of the present invention.

The signal flow graph of FIG. 13 is equal to that of the FIG. 12. The signal flow graph of FIG. 12 can be substituted with the flow graph of FIG. 13 that reduces the number of multiplication operation carried out in FIG. 12 to ½ by using the distributive law that will be described afterwards in the present embodiment.

By extending this one-dimensional filter coefficient in the direction of two dimensions, i.e., also in the line direction, the amount of computation can be reduced for two-dimensional filter coefficients with symmetry.

The 2×2 two-dimensional filter coefficients of FIG. 15 becomes $\alpha 00=\alpha 01=\alpha 10=\alpha 11$ in FIG. 2.

By carrying out a process similar to that of the first embodiment using such filter coefficients with symmetry, the four multiplied results enclosed by a dotted line in FIG. 15 are equal to each other, and the four multiplied results enclosed by a solid line in FIG. 15 are equal to each other.

Therefore, the amount of computation can be reduced by carrying out a multiplication of a certain image data and a filter coefficient just once, and writing that multiplied result into the corresponding four address locations in memory 3.

For example, if the filter coefficients possesses symmetry such as $\alpha 00=\alpha 01=\alpha 10=\alpha 11$, the above-described equation (4) for obtaining a two-dimensional filter processing result 2DF(3, 3) can be substituted as:

$$2DF(3, 3)=\alpha 00\times[data\ (2, 2)+data\ (2, 3)+data\ (3, 2)+data\ (3, 3)] \quad (5)$$

applying the distributive law.

In contrast to the conventional art in which a process of four adding operations and four multiplying operations are carried out for one image data, only four adding operations and one multiplication operation is required in the present embodiment in a two-dimensional digital filter process using 2×2 filter coefficients of symmetry. Therefore, the amount of computation can be significantly reduced.

For example, computation in the first embodiment associated with image data (2, 2) is shown by the above-described equations (1)–(4). Since $\alpha 00=\alpha 01=\alpha 10=\alpha 11$, equations (1)–(4) can be replaced with the following equations (6)–(9).

$$2DF(2, 2)=\alpha 00\times[data\ (1, 1)+data\ (1, 2)+data\ (2, 1)+ data\ (2, 2)] \quad (6)$$

$$2DF(2, 3)=\alpha 00\times[data\ (1, 2)+data\ (1, 3)+data\ (2, 2)+ data\ (2, 3)^*] \quad (7)$$

$$2DF(3, 2)=\alpha 00\times[data\ (2, 1)+data\ (2, 2)+data\ (3, 1)^*+ data\ (3, 2)^*] \quad (8)$$

$$2DF(3, 3)=\alpha 00\times[data\ (2, 2)+data\ (2, 3)^*+data\ (3, 2)^*+ data\ (3, 3)^*] \quad (9)$$

The multiplied result of $\alpha 00\times$data (2, 2) associated with processed result 2DF(2, 2) is added into the contents of an address in memory cell that stores processed result 2DF(2, 2), as well as into the contents of each address in memory 3 storing respective processed results of 2DF(2, 3), 2DF(3, 2) and 2DF(3, 3). Therefore, three multiplication operations can be eliminated.

This reduction in the amount of computation becomes more significant with a greater number of two-dimensional filter coefficients.

Since the amount of two-dimensional digital filtering is reduced to a half in comparison with conventional art to result in reduction in the number of times of access to image memory 3 in the second embodiment, high speed processing is facilitated.

Third Embodiment

In the third embodiment, the number of data packets dispatched from data driven processor 1 to image memory unit 16 is reduced in the operation of memory reference which is the basic operation during filtering to relieve the bottleneck in increasing the processing speed caused by off-chip packet transfer.

In the present embodiment, an operation code is employed that effects reference of two address locations in a memory at the same time and that allows operation on a reference value with one instruction.

VNADD (i, j, k), for example, is introduced as this operation code, where "VNADD (i," implies an instruction including the steps of referring to two address locations in a memory, adding the reference result, arithmetic right-shifting the added results by i, and providing the result thereof. Here, the offset modifier value of each referred address is ("j, k"). More specifically, the first referred address 1 has a field offset modifier value=line offset modifier value=0, and a pixel offset modifier value=j. The second referred address 2 has a field offset modifier value=line offset modifier value=0, and a pixel offset modifier value=k.

When (2, 3, 5) as generation number GN# is processed by an operation code C of VNADD (3, 1, −1), two addresses corresponding to memory addresses (2, 3, 6) and (2, 3, 4) are referred to. Each referred result is added, and arithmetic-shifted rightwards by 3. The output is provided as the result.

It is assumed that an operation code C that refers to two memory address locations at the same time as the above-described VNADD (3, 1, −1) is stored in a program of a prestored filter process in main processing unit 13 of data driven processor 1, and that this operation code C is currently executed.

Here, a data packet having information associated with two memory addresses is transferred from processor 1 to image memory unit 16. In this case, the structure of the data packet of FIG. 19 is treated as having a structure shown in FIG. 16.

Figure 16:
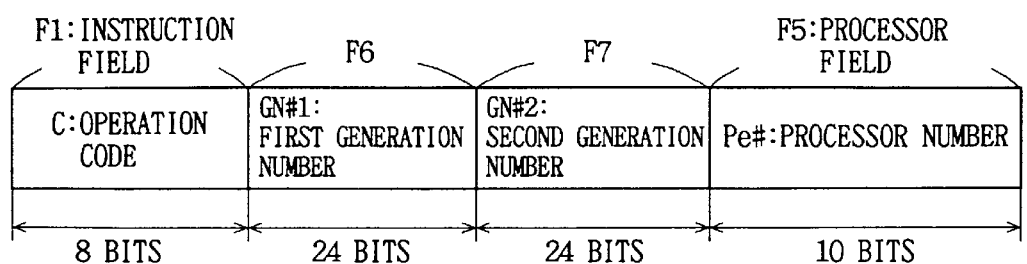
FIG. 16 shows a field structure of an input packet towards a memory interface unit 20 for concurrent memory reference according to a third embodiment of the present invention.

In the data packet of FIG. 16, generation field F2, first data field F3, and second data field F4 of the data packet of FIG. 19 are interpreted as first generation field F6 storing first generation number GN#1 and a second generation field F7 that stores a second generation number GN#2.

Here, the high order two bits, for example, of a corresponding operation code C are set to "1" to be determined as an operation code of concurrent memory access by concurrent memory access determination unit 21 shown in FIG. 11.

When the data packet of FIG. 16 is applied to concurrent memory access determination unit 21 of memory interface 20 via transmission line 24 of FIG. 11 in a concurrent memory access operation, determination unit 21 refers to the high order 2 bits of operation code C in the input packet.

When the high order 2 bits are both "1" as a result of reference, determination of a concurrent memory access is made to provide a determination result signal JS1 of "1", for example, otherwise determination is made of a non-current memory access, i.e. memory access of only one address to provide determination result signal JS1 of "0". The input packet is provided to memory access unit 22 in association with an output of determination result signal JS1.

Memory access unit 22 accesses image memory 3 according to a data packet input via transmission line 25 and determination result signal JS1 input via control line 26.

Memory access unit 22 recognizes that the input packet is for concurrent memory access when determination result signal JS1 is "1" to refer to two address locations in image memory 3 on the basis of first generation number GN#1 and second generation number GN#2 via control line 28 according to the field structure of the data packet shown in FIG. 16.

The referred results of the two address locations are stored into the data packet as first and second data D1 and D2 shown in FIG. 19 to be provided to main processing unit 13 in processor 1 via transmission line 17 and input port IV.

When determination result signal JS1 is "0", memory access unit 22 recognizes the input packet to be a packet for a normal memory access to access image memory 3 according to operation code C via control line 28 by addressing based on generation number GN# according to the field structure of the data packet shown in FIG. 19.

When operation code C is a reference instruction, data read out from image memory 3 is taken as first data D1 shown in FIG. 19 to be provided from memory access unit 21 to data driven processor 1 via transmission line 27.

When operation code C is a write instruction, first data D1 is written into memory 3 by addressing based on generation number GN#. The written data is returned to memory access unit 22.

If the data packet after access of image memory unit 16 provided to main processing unit 13 has an operation code C that relates to memory reference including concurrent memory access, operation is carried on data D1 and D2 which are the referred result. For example, when operation code C is "VNADD (3,", referred data D1 is "50", and referred data D2 is "15", data D1 and data D2 are added and then arithmetic-shifted by 3 rightwards to be output as "8".

Figure 14:
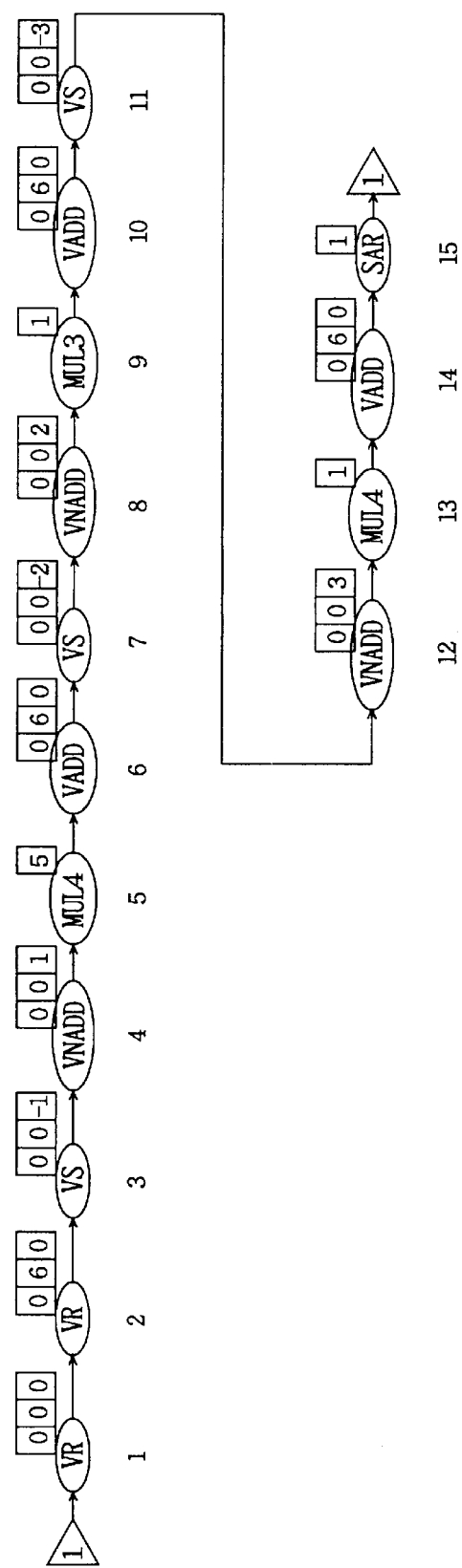
FIG. 14 is a data flow graph of a digital filter process shown in the signal flow graph of FIG. 13.
Figure 17:
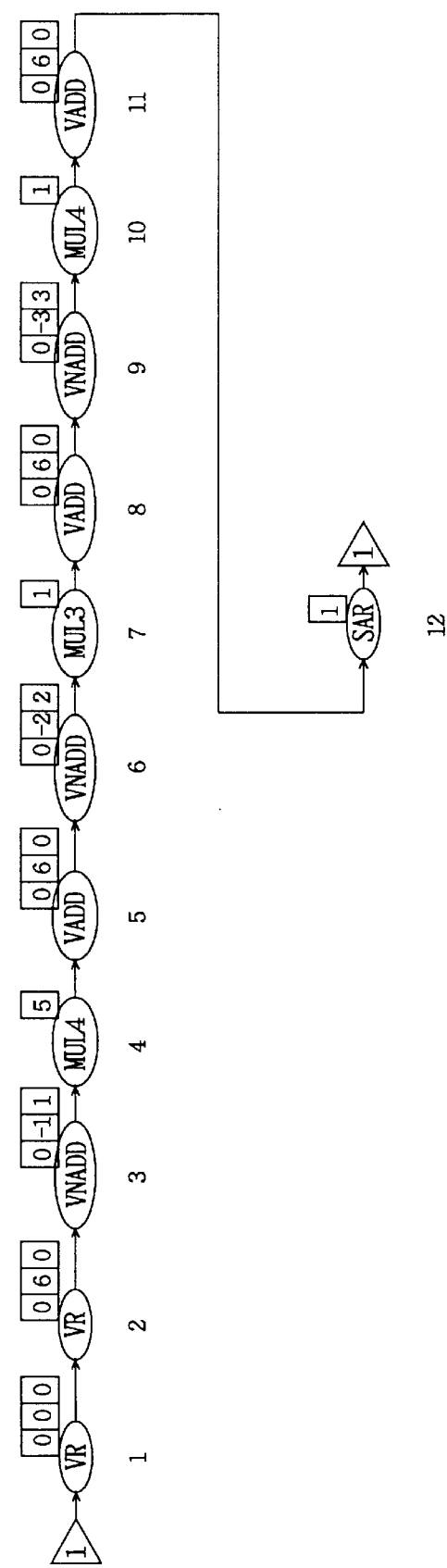
FIG. 17 is a graph which is a converted version of the flow graph of FIG. 14 according to the third embodiment of the present invention.

By executing a concurrent memory access instruction according to the third embodiment, three instructions can be eliminated as shown in FIG. 17 in contrast to that shown in FIG. 14. Since the instruction that can be eliminated is an off-chip instruction related to access of image memory 3, improvement in the processing speed is facilitated.

The device for implementing a digital filter process according to the above-described embodiments is not limited to a data driven processor, and may be a von Neumann type processor. Furthermore, the digital filter process may be two dimensional, or one-dimensional.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A digital filter processing device that receives a plurality of image data forming a frame for a digital filter process using a plurality of filter coefficients corresponding to each of a plurality of image data in a group for every group of image data corresponding to each of a plurality of regions of a predetermined size in said frame, comprising:
   a storage unit;
   wherein each of said plurality of image data is received and stored in said storage unit, whereby said stored image data is multiplied by the corresponding said filter coefficients to be accumulated for every said group, and output as an accumulation result in an order of time series according to a scanning operation of said frame.

2. The digital filter processing device according to claim 1, further comprising:
   a processing unit that transfers data with said storage unit;
   wherein said processing unit comprises
      multiply means to read out said image data stored in said storage unit for multiplying said readout image data by the corresponding said filter coefficient in the order of said time series,
      accumulation means for sequentially accumulating and storing in said time series a multiplied result by said multiply means into a content of a predetermined address corresponding to said multiplied image data in said storage unit, and
      means for reading out a result of a corresponding accumulation from said storage unit according to completion of said accumulation for every said group.

3. The digital filter processing device according to claim 2, characterized in that access of said storage unit includes concurrent access in which two addresses in said storage unit are referred to at the same time by one access.

4. The digital filter processing device according to claim 2, characterized in that distributive law is applied in said multiplication and said accumulation when respective said filter coefficients corresponding to respective said image data in said group has the same value symmetrically in at least one of a horizontal direction and a vertical direction in said frame.

5. The digital filter processing device according to claim 4, characterized in that access of said storage unit includes concurrent access in which two addresses in said storage unit are referred to at the same time by one access.

6. The digital filter processing device according to claim 5, further comprising an access control unit for controlling access of said storage unit by said processing unit, wherein said access control unit comprises a determination unit for making determination whether an access request of said processing unit to said storage unit is a request of said concurrent access, and address calculation unit responsive to said determination of said determination unit that said access request is said concurrent access request for calculating said two addresses according to contents of said concurrent access request.

7. The digital filter processing device according to claim 1, characterized in that distributive law is applied in said multiplication and said accumulation when respective said filter coefficients corresponding to respective said image data in said group have the same value symmetrically in at least one of a horizontal direction and a vertical direction in said frame.

8. The digital filter processing device according to claim 7, characterized in that access of said storage unit includes concurrent access in which two addresses in said storage unit are referred to at the same time by one access.

9. The digital filter processing device according to claim 1, characterized in that access of said storage unit includes concurrent access in which two addresses in said storage unit are referred to at the same time by one access.

10. A digital filter processing device, comprising:

a plurality of image data forming a frame of pixels arranged in groups within predetermined regions of the frame a plurality of filter coefficients corresponding to each of the plurality of image data;

a processing unit that multiplies each of the plurality of image data by the plurality of corresponding filter coefficients to produce a corresponding filtered image data; and an image memory unit including an image memory that stores the plurality of image data and that stores the corresponding filtered image data into a corresponding address, the corresponding address representing an accumulation of the corresponding filtered image data from a corresponding one of the groups of pixels, the image memory unit outputting the corresponding address in an order of time series upon completion of the accumulation of all of the groups.

11. The digital filter processing device according to claim 10, wherein a distributive law is applied by the processing unit and the image memory unit when respective filter coefficients corresponding to respective image data in the groups have the same value symmetrically in at least one of a horizontal direction and a vertical direction in the frame.

12. The digital filter processing device according to claim 11, wherein an access of the image memory unit includes a concurrent access in which two addresses in the image memory unit are concurrently referred to by one access.

13. The digital filter processing device according to claim 12, further comprising an access control unit that controls access of the image memory unit by the processing unit, the access control unit including a determination unit that determines whether an access request of the processing unit to the image memory unit is a request of the concurrent access, and an address calculation unit responsive to the determination of the determination unit that the access request is the concurrent access request for calculating the two addresses according to contents of the concurrent access request.

14. A method of digital filter processing, comprising:

(a) receiving and storing a plurality of image data forming a frame;

(b) multiplying the stored image data by a plurality of filter coefficients corresponding to each of a plurality of image data in a group for every group of image data corresponding to each of a plurality of regions of a predetermined size in the frame in an order of the time series to produce a corresponding filtered image data;

(c) sequentially accumulating and storing in the time series the corresponding filtered image data of each group of image data into a corresponding address; and (d) outputting each corresponding address in an order of time series upon completion of the sequential addition of all of the groups.

15. The method of claim 14, further comprising (e) applying a distributive law in step (b) and step (c) when respective filter coefficients corresponding to respective image data in the groups have the same value symmetrically in at least one of a horizontal direction and a vertical direction in the frame.

16. The method of claim 15, further comprising (f) concurrently accessing two addresses of respective image data for step (e) in one access.

17. The method of claim 16, further comprising:

(g) determining whether an access request is a concurrent access request, and (h) calculating the two addresses according to contents of the concurrent access request.

* * * * *